US 11,131,699 B2

(12) United States Patent
Sakamaki et al.

(10) Patent No.: US 11,131,699 B2
(45) Date of Patent: Sep. 28, 2021

(54) METHOD FOR DETERMINING PROBE ANGLE, HIGH-FREQUENCY TEST SYSTEM, PROGRAM AND STORAGE MEDIUM

(71) Applicant: NATIONAL INSTITUTE OF ADVANCED INDUSTRIAL SCIENCE AND TECHNOLOGY, Tokyo (JP)

(72) Inventors: Ryo Sakamaki, Tsukuba (JP); Masahiro Horibe, Tsukuba (JP)

(73) Assignee: NATIONAL INSTITUTE OF ADVANCED SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/641,807

(22) PCT Filed: Sep. 7, 2018

(86) PCT No.: PCT/JP2018/033254
§ 371 (c)(1),
(2) Date: Feb. 25, 2020

(87) PCT Pub. No.: WO2019/050001
PCT Pub. Date: Mar. 14, 2019

(65) Prior Publication Data
US 2020/0233022 A1 Jul. 23, 2020

(30) Foreign Application Priority Data

Sep. 7, 2017 (JP) .............................. JP2017-171927
Jan. 31, 2018 (JP) .............................. JP2018-014349

(51) Int. Cl.
*G01R 27/06* (2006.01)
*G01R 1/067* (2006.01)
*G01R 31/28* (2006.01)

(52) U.S. Cl.
CPC .......... *G01R 27/06* (2013.01); *G01R 1/06772* (2013.01); *G01R 31/28* (2013.01)

(58) Field of Classification Search
CPC ....... G01N 2291/012; G01N 2291/018; G01N 29/036; G01N 22/00; G01N 2291/0423;
(Continued)

(56) References Cited

U.S. PATENT DOCUMENTS 7,164,279 B2 * 1/2007 Strid .................... B82Y 15/00
324/73.1
7,239,150 B2 * 7/2007 Troxler ................. G01N 33/42
324/643
(Continued)

FOREIGN PATENT DOCUMENTS

JP       03-51777 A    3/1991
JP       10-116863 A   5/1998
(Continued)

OTHER PUBLICATIONS

Cascade Microtech Co.; RF Measurement Guide; Feb. 2010; (cited in International Search Report of PCT/JP2018/033254).
(Continued)

*Primary Examiner* — Vinh P Nguyen
(74) *Attorney, Agent, or Firm* — Kilpatrick Townsend & Stockton LLP

(57) ABSTRACT

A method that includes changing a probe angle with respect to the conductor surface of a substrate that has a flat conductor surface mounted on the mounting surface of a stage in a high-frequency test system, thereby changing the state of contact of the tip of a signal terminal and tip of a ground terminal with the conductor surface, outputting high-frequency signals from the signal terminal to the conductor surface and receiving reflected signals using the probe to find S-parameters at different probe angles, and
(Continued)

determining, based on a plurality of the S-parameters, a reference probe angle at which the reference line formed connecting the tip of the signal terminal and tip of the ground terminal is parallel with the conductor surface.

10 Claims, 8 Drawing Sheets

(58) Field of Classification Search
CPC .............. G01N 22/02; G01R 1/06772; G01R 31/2822; G01R 1/06744; G01R 27/06; G01R 31/2837; G01R 35/00; G01R 1/06711; G01R 27/00; G01R 27/28; G01R 31/11; G01R 31/26; G01R 31/28; G01R 31/2891; H01L 2223/6627; H01L 23/5227; H01L 23/66; H01R 13/622; H01R 24/38
See application file for complete search history.

(56) References Cited

U.S. PATENT DOCUMENTS

| | | | |
|---|---|---|---|
| 7,906,979 B2* | 3/2011 | Fjerstad | G01R 1/06772 324/754.07 |
| 7,908,107 B2* | 3/2011 | Hayden | G01D 18/00 702/107 |
| 8,035,409 B2* | 10/2011 | Deutsch | G01R 31/2822 324/763.01 |
| 8,212,580 B2* | 7/2012 | Izadian | G01R 1/045 324/755.02 |
| 8,479,308 B2* | 7/2013 | Nishimura | G01Q 10/045 850/1 |
| 8,933,707 B1 | 1/2015 | Tsironis | |
| 10,459,006 B2* | 10/2019 | Fisher | G01R 31/2891 |
| 2011/0227601 A1 | 9/2011 | Hashimoto et al. | |
| 2013/0015870 A1 | 1/2013 | Nickel et al. | |
| 2020/0124669 A1* | 4/2020 | Sakamaki | G01R 1/073 |

FOREIGN PATENT DOCUMENTS

| | | |
|---|---|---|
| JP | 2000-232143 A | 8/2000 |
| JP | 2011-196813 A | 10/2011 |
| WO | 2017/203876 A1 | 11/2017 |

OTHER PUBLICATIONS

Sakamaki, et al.; Proposal of a Precision Probe-Tilt Adjustment with the RF Signal Detection Technique; 2018 Conference on Precision Electromagnetic Measurements; Jul. 11, 2018.

Japan Patent Office; International Search Report of PCT/JP2018/033254; dated Nov. 27, 2018.

* cited by examiner

Reflection coefficient of reflected signal = $|S11| \angle \theta 11$     (1)

$$S11 = Re(S11) + j\ Im(S11) \qquad (2)$$

METHOD FOR DETERMINING PROBE ANGLE, HIGH-FREQUENCY TEST SYSTEM, PROGRAM AND STORAGE MEDIUM

CROSS-REFERENCE TO RELATED APPLICATIONS

The present application is a § 371 National Phase Application of PCT/JP2018/033254, filed Sep. 7, 2018, which application claims the benefit of Japanese Patent Application No. 2018-014349, filed Jan. 31, 2018, and Japanese Patent Application No. 2017-171927, filed Sep. 7, 2017, the entire contents of which are incorporated by reference in their entireties for all purposes herein.

FIELD

The present invention relates to a method for determining a probe angle, and to a high-frequency test system, program and storage medium.

BACKGROUND

High-frequency test systems (high-frequency characteristic inspection devices) have been used in the prior art to carry out specified electrical inspection of circuits.

High-frequency test systems are used for measurement of the impedance of planar circuits that operate with high frequency signals in the millimeter wave band, for example.

A high-frequency test system has a probe (also known as a high-frequency probe) that sends and receives signals with a device to be tested (Device Under Test: DUT), such as a planar circuit or a network to be tested. The high-frequency test system uses the probe to measure a transmission signal transmitted to the DUT or a reflected signal that has been reflected from the DUT.

The probe has a signal terminal (S terminal) and a ground terminal (G terminal), which are in electrical contact with the DUT. The signal terminal outputs signals to the DUT. The ground terminal is grounded. The signal terminal and ground terminal are disposed on the main body of the probe in a mutually separated manner and extending in parallel.

The probe has one or more signal terminals (S terminals) and one or more ground terminals (G terminals). The type of probe is, for example, an S-G type or a G-S type, G-S-G type or G-S-G-S-G type. An S-G type or G-S type probe has one signal terminal and one ground terminal. A G-S-G type probe has two ground terminals and one signal terminal, with the signal terminal disposed between the two ground terminals. A G-S-G-S-G type probe has three ground terminals and two signal terminals, with one signal terminal disposed between each of the two ground terminals.

For measurement of the DUT, the inclination (angle) of the probe is adjusted so that the tip of the signal terminal and the tip of the ground terminal are in adequate electrical contact with the measuring surface of the DUT (see PTL 1, for example).

Specifically, the probe angle is adjusted so that the orientation of a reference line formed connecting the tip of the signal terminal and the tip of the ground terminal, is parallel with the measuring surface of the DUT. Thus, the tip of the signal terminal and the tip of the ground terminal will be in contact with the measuring surface of the DUT in the same manner electrically.

FIG. 1(A) and FIG. 1(B) are drawings illustrating a method of adjusting the probe angle in the prior art.

The substrate 21 is used for adjustment of the probe angle. The substrate 21 has a flat conductor surface 22. The conductor surface 22 is formed using a metal plate, for example. The probe 1 is a G-S-G type. In prior art methods (see NPL 1, for example), first the tips of the signal terminal and the ground terminals are contacted with the conductor surface 22, forming indentations on the conductor surface 22. Next, a microscope is used to observe the indentations formed on the conductor surface 22. The probe angle is judged to be correct if three indentations have been formed on the conductor surface 22 (see FIG. 1(B)). If the number of indentations formed on the conductor surface 22 is one or two, however (see FIG. 1(A)), the probe angle is judged to be incorrect. The probe angle is then adjusted so that three indentations are formed on the conductor surface 22. By adjusting the probe angle so that three indentations are formed on the conductor surface 22, the orientation of the reference line L formed connecting the tip of the signal terminal and the tip of the ground terminal, becomes parallel with the conductor surface 22.

CITATION LIST

Patent Literature

[PTL 1] International Patent Publication No. WO2017/203876

Non Patent Literature

[NPL 1] Cascade Microtech Co., "RF Measurement Guide" [online], [searched on Sep. 7, 2017]internet: <https://www.cascademicrotech.com/files/JPN_RF_Measurement_Guide_Rev203.pdf>

SUMMARY

However, the following problems are associated with this method of adjusting the probe angle.

(1) Since the state of the indentations varies greatly depending on the condition of the tip of the probe used, the indentations are virtually invisible on the conductor surface 22 in some cases, depending on the probe.

(2) Even when three indentations are formed on the conductor surface 22, there is about a 1° width in the precision of the probe angle.

(3) Since the indentations may be difficult to observe depending on the positional relationship between the microscope and the indentations, determining the probe angle is greatly dependent on the sense and experience of the operator.

The present specification provides means for adjusting a probe angle by electrical signal sensing. Because the reflected signal which was input by the probe changes depending on the contact state between the ground terminals and signal terminal of the probe and the conductor surface, the S-parameter that is obtained also changes. As described in the present specification, therefore, the state of contact between the probes and the conductor surface is examined based on the S-parameter of the reflected signal, and a probe angle is determined such that the orientation of a reference line L formed connecting the tip of the signal terminal and the tip of the ground terminal is parallel with the conductor surface 22.

According to a method for determining the probe angle as disclosed herein, the method for determining a reference angle of a probe around a rotation axis in a high-frequency test system which has a controller, a vector network analyzer controlled by the controller, a stage having a flat mounting surface on which a device under test is mounted, a probe having a signal terminal and ground terminal that are able to send and receive signals with the vector network analyzer, the probe being able to change the state of contact of the tip of the signal terminal and tip of the ground terminal with the device under test by rotating with the rotation axis as the center, and a driving unit that is controlled by the controller and causes rotation of the probe around the rotation axis, includes the controller controlling the driving unit to change the angle of the probe around the rotation axis, thereby changing the state of contact of the tip of the signal terminal and tip of the ground terminal, with the conductor surface of the substrate that has a flat conductor surface mounted on the mounting surface of the stage, while controlling the vector network analyzer to output a high-frequency signal from the signal terminal to the conductor surface and receive a reflected signal using the probe to find the S-parameter, at different angles of the probe around the rotation axis; and the controller determining, based on a plurality of the S-parameters, the reference angle of the probe around the rotation axis at which the reference line formed connecting the tip of the signal terminal and tip of the ground terminal is parallel with the conductor surface.

According to a high-frequency test system as disclosed herein, the high-frequency test system includes a controller, a vector network analyzer controlled by the controller, a stage having a flat mounting surface on which a Device Under Test is mounted, a probe having a signal terminal and ground terminal that are able to send and receive signals with the vector network analyzer, the probe being able to change the state of contact of the tip of the signal terminal and tip of the ground terminal with the device under test by rotating with the rotation axis as the center and a driving unit that is controlled by the controller and causes rotation of the probe around the rotation axis. The controller controls the driving unit to change the angle of the probe around the rotation axis, thereby changing the state of contact of the tip of the signal terminal and tip of the ground terminal with the conductor surface of the substrate that has a flat conductor surface mounted on the mounting surface of the stage, while controlling the vector network analyzer to output a high-frequency signal from the signal terminal to the conductor surface and receive a reflected signal using the probe to find the S-parameter, at different angles of the probe around the rotation axis, and determines, based on a plurality of the S-parameters, the reference angle of the probe around the rotation axis at which the reference line formed connecting the tip of the signal terminal and tip of the ground terminal is parallel with the conductor surface.

According to a computer program as disclosed herein, the computer program that causes a computer to execute determination of a reference angle of a probe around the rotation axis in a high-frequency test system which has a computer, a vector network analyzer controlled by the computer, a stage having a flat mounting surface on which a device under test is mounted, a probe having a signal terminal and ground terminal that are able to send and receive signals with the vector network analyzer, the probe being able to change the state of contact of the tip of the signal terminal and tip of the ground terminal with the device under test by rotating with the rotation axis as the center, and a driving unit that is controlled by the computer and causes rotation of the probe around the rotation axis, the program causing the computer to execute: controlling of the driving unit to change the angle of the probe around the rotation axis, thereby changing the state of contact of the tip of the signal terminal and tip of the ground terminal with the conductor surface of the substrate that has a flat conductor surface mounted on the mounting surface of the stage, while controlling the vector network analyzer to output a high-frequency signal from the signal terminal to the conductor surface and receive a reflected signal using the probe to find the S-parameter, at different angles of the probe around the rotation axis; and determining, based on a plurality of the S-parameters, the reference angle of the probe around the rotation axis at which the reference line formed connecting the tip of the signal terminal and tip of the ground terminal is parallel with the conductor surface.

In addition, according to a non-transitory storage medium as disclosed herein, the non-transitory storage medium that stores a computer program that causes a computer to execute determination of a reference angle of a probe around the rotation axis in a high-frequency test system which has a computer, a vector network analyzer controlled by the computer, a stage having a flat mounting surface on which a device under test is mounted, a probe having a signal terminal and ground terminal that are able to send and receive signals with the vector network analyzer, the probe being able to change the state of contact of the tip of the signal terminal and tip of the ground terminal with the device under test by rotating with the rotation axis as the center, and a driving unit that is controlled by the computer and causes rotation of the probe around the rotation axis, the computer program causing the computer to execute: controlling of the driving unit to change the angle of the probe around the rotation axis, thereby changing the state of contact of the tip of the signal terminal and tip of the ground terminal with the conductor surface of the substrate that has a flat conductor surface mounted on the mounting surface of the stage, while controlling the vector network analyzer to output a high-frequency signal from the signal terminal to the conductor surface and receive a reflected signal using the probe to find the S-parameter, at different angles of the probe around the rotation axis; and determining, based on a plurality of a plurality of the S-parameters, the reference angle of the probe around the rotation axis at which the reference line formed connecting the tip of the signal terminal and tip of the ground terminal is parallel with the conductor surface.

The method, high-frequency test system, program and storage medium disclosed herein allow the correct probe inclination to be determined at high precision in a high-frequency test system.

DESCRIPTION OF EMBODIMENTS

A first preferred embodiment of the high-frequency test system disclosed herein will now be described with reference to the accompanying drawings. However, the technical scope of the invention is not limited to this embodiment, and includes the invention and its equivalents as laid out in the Claims.

Figure 2:
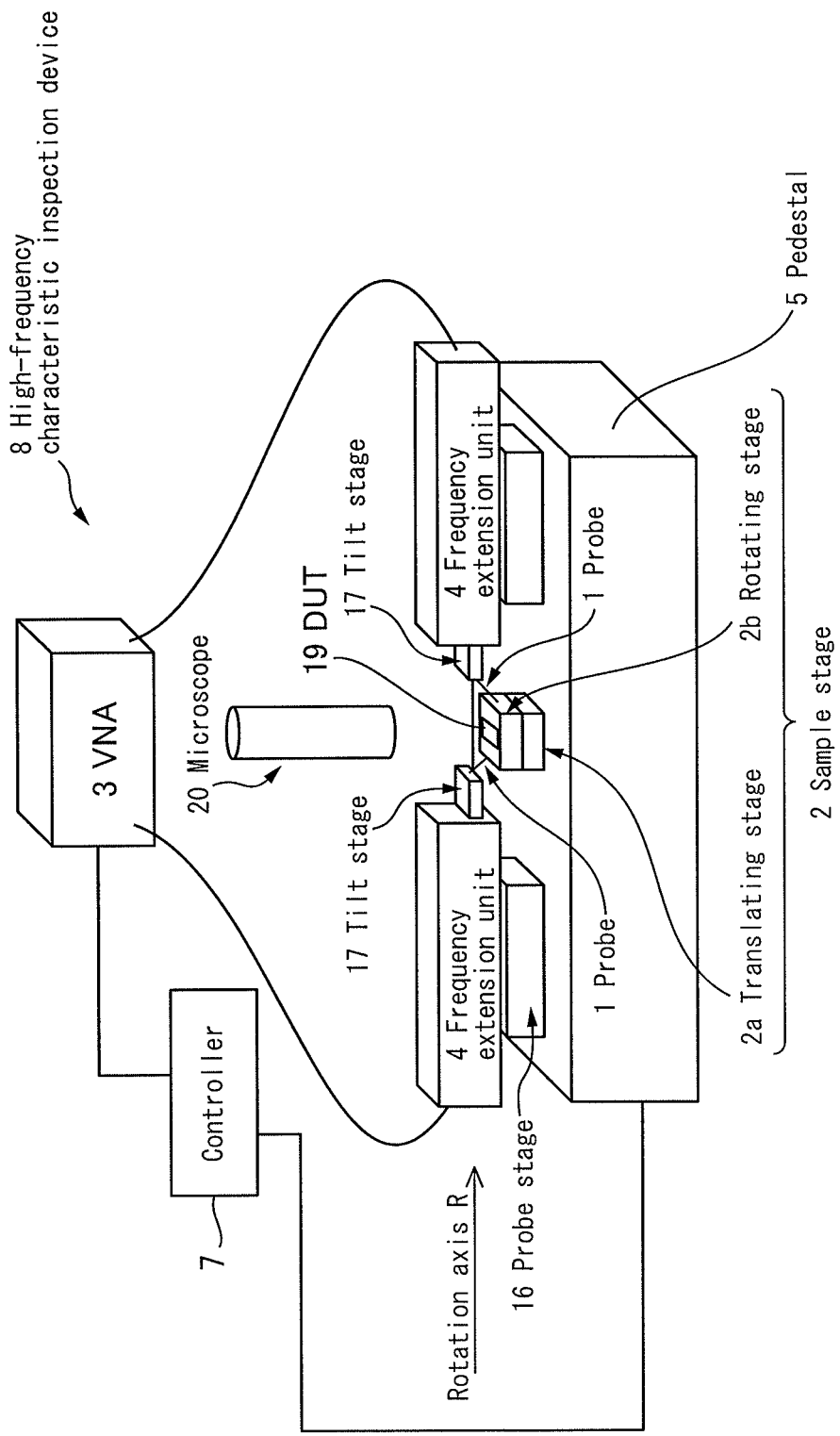
FIG. 2 is a drawing showing the high-frequency test system disclosed herein.

FIG. 2 is a drawing showing the high-frequency test system disclosed herein.

The high-frequency test system 8 of this embodiment comprises a controller 7, a vector network analyzer (VNA) 3, a sample stage 2, a pair of probes 1, a pair of tilt stages 17, a pair of frequency extension units 4, a pair of probe stages 16, a pedestal 5 and a microscope 20.

The vector network analyzer 3 outputs a high-frequency signal for evaluation of the electrical characteristics of a DUT 19, and inputs a transmission signal and reflected signal from the DUT 19 for analysis.

The sample stage 2 is disposed on the pedestal 5. The sample stage 2 has a flat mounting surface on which the DUT 19 is mounted. The sample stage 2 has a translating stage 2a that can translate the mounting surface in the X-axial direction, Y-axial direction and Z-axial direction, and a rotating stage 2b can rotate the mounting surface around a rotation axis R as the center. The X-axial direction and Y-axial direction of the translating stage 2a are not affected by rotation of the rotating stage 2b.

The pair of probes 1 are disposed on the tilt stage 17 facing each other with the sample stage 2 between them. Each probe 1 has at least one signal terminal (S terminal) and at least one ground terminal (G terminal). The tips of the signal terminals and the tips of the ground terminals are capable of electrical contact with the measuring surface of the DUT. The signal terminals and ground terminals can send and receive signals with the vector network analyzer 3.

Figure 1:
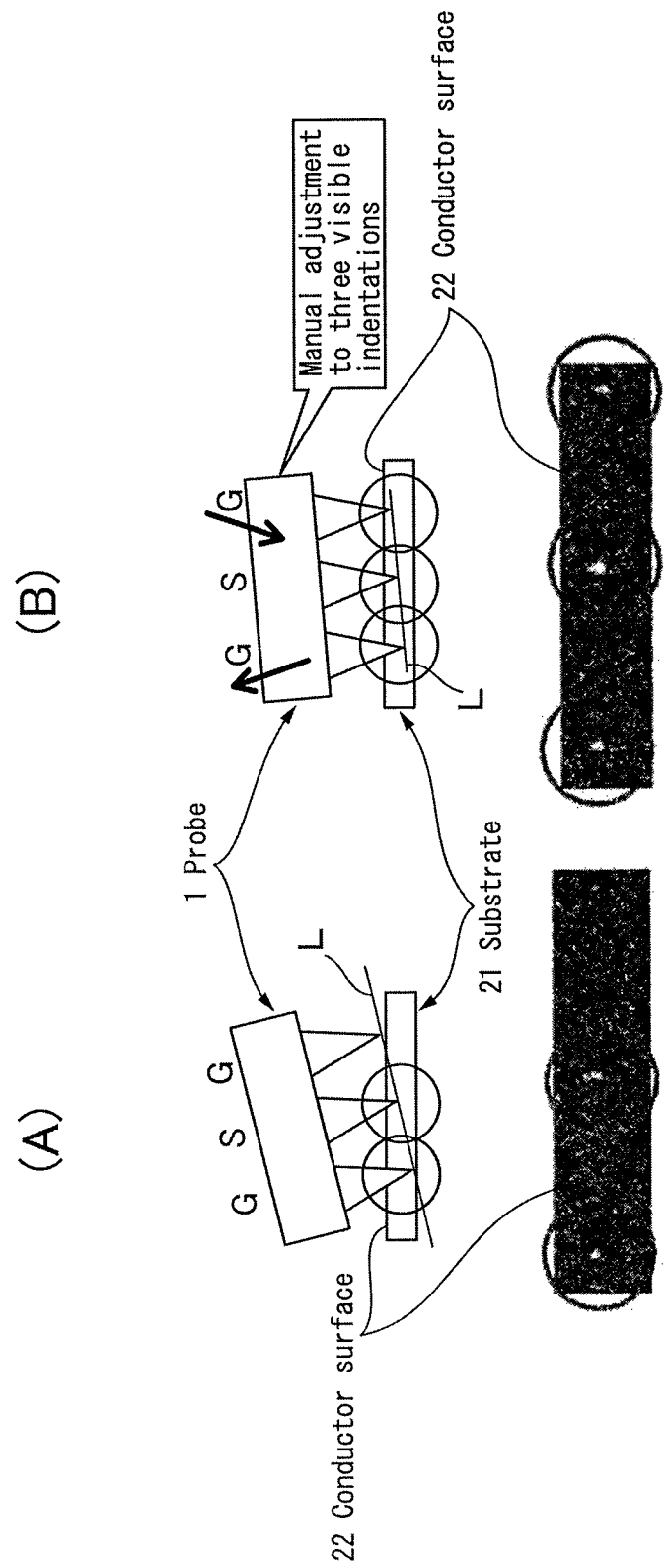
FIG. 1(A) and FIG. 1(B) are drawings illustrating a method of adjusting a probe angle according to the prior art.

The reference line L is formed by connecting the tip of the signal terminal and the tips of the ground terminals (see FIG. 1(A) and FIG. 1(B)). When the probe has three or more terminals, the reference line L connecting the tips of the terminals may not be a line in the strict sense. This is because, depending on the machining precision of the probe, the line connecting the tips of the terminals may not qualify as a straight line. Divergence from a straight line is acceptable for the linearity of the reference line L. The state of contact of the tip of the signal terminal and tips of the ground terminals with the measuring surface of the DUT can be changed by making the tilt stage 17 rotate the probe 1 around the rotation axis R as the center. By rotating the probe 1 around the rotation axis R as the center, the inclination of the reference line L with respect to the measuring surface of the DUT is adjusted. The rotational position of the probe 1 around the rotation axis R may also be referred to hereunder as the "probe angle".

The pair of frequency extension units 4 are disposed on the probe stage 16 facing each other with the sample stage 2 between them. Each frequency extension unit 4 extends the frequency of the signal input from the vector network analyzer 3, and outputs it to the signal terminal. The frequency extension units 4 are used when the vector network analyzer 3 outputs a signal of a frequency that cannot be produced. The pair of tilt stages 17 are anchored to the frequency extension units 4 in a mutually facing manner. For the present specification, the function of each frequency extension unit 4 is included in the vector network analyzer 3.

The pair of probe stages 16 are disposed on the pedestal 5 facing each other with the sample stage 2 between them. The probe stages 16 are able to translate the frequency extension units 4 in the X-axial direction, Y-axial direction and Z-axial direction. Movement by the frequency extension units 4 allows the locations of the probes 1 to be moved.

The controller 7 controls operation of the vector network analyzer 3, the sample stage 2, the tilt stages 17 and the probe stages 16. A computer comprising a processor, memory, interface, display screen and actuator, for example, may be used as the controller 7. The function of the controller 7 can be carried out by allowing the processor to execute the computer program stored in memory. The computer program can be stored in a non-temporary storage medium, for example. The function of the controller 7 may also be implemented in the controller 7, as a circuit.

The microscope 20 is used to observe the indentations formed in the DUT that has been mounted on the mounting surface of the sample stage 2.

Before measuring the electrical characteristics of the DUT, the high-frequency test system 8 uses the adjusting substrates 21 (see FIG. 1) to determine the probe angle at which the orientation of the reference line L formed connecting the tips of the signal terminal and tips of the ground terminals, is parallel to the measuring surface of the DUT (this will hereunder be referred to as "reference probe angle").

The adjusting substrates 21 each have, for example, a substrate body that is electrical insulating or electrical conducting, and a metal plate situated on the substrate body. The metal plate has a flat conductor surface 22. The metal plate can be formed by vapor depositing a metal such as gold on the substrate body, for example.

The high-frequency test system 8 changes the probe angles of the probes 1 while changing the state of contact of the tips of the signal terminals and tips of the ground terminals with the conductor surface 22, outputting high-frequency signals from the signal terminals to the conductor surface and receiving the reflected signals using the probes 1 at different probe angles, to determine the S-parameters. In addition, the high-frequency test system 8 determines the reference probe angle at which each reference line L formed connecting the tips of the signal terminals and tips of the ground terminals is parallel with the conductor surface 22, based on a plurality of the S-parameters.

The S-parameter of the reflected signal will now be explained with reference to FIG. 3.

Figure 3:
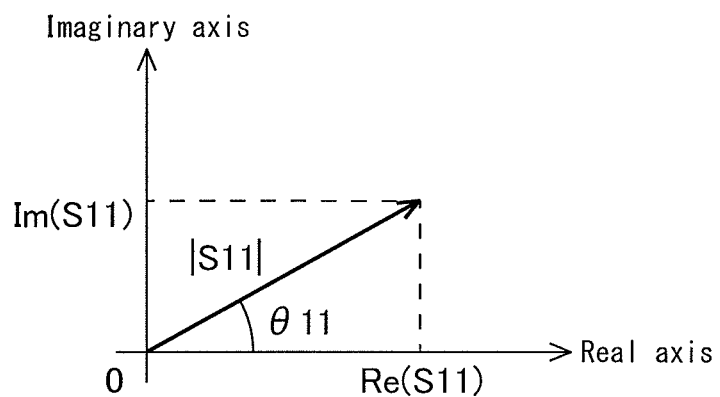
FIG. 3 is a drawing illustrating the reflected signal reflection coefficient and S11 parameter.

FIG. 3 is a drawing illustrating the S11 parameter of a reflected signal.

The vector network analyzer 3 outputs a high-frequency signal from the signal terminal of the probe 1, and analyzes the reflected signal input at the signal terminal to determine the amplitude and phase of the reflected signal. In the case of a G-S-G type probe, for example, the S-parameter of a reflected signal output from a signal terminal and input at the same signal terminal is represented as S11. If the reflected signal amplitude is |S11| and the phase is θ11, then the reflection coefficient of the reflected signal is represented by formula (1), using the amplitude and phase of the reflected signal.

The reflection coefficient of the reflected signal is represented by a vector on a complex plane, with the origin as the starting point. Where the coordinate of the vector on the real axis is Re(S11) and the coordinate on the imaginary axis is Im(S11), the S11 parameter is represented by formula (2) using Re(S11) and Im(S11).

The phase θ11 of the reflection coefficient can be found, for example, using Re(S11) and Im(S11), by the inverse trigonometric function.

In the first operation example of the high-frequency test system 8, the reflection coefficient phases of a plurality of the reflected signals are determined based on each of a plurality of the S-parameters.

The reflection coefficient phases of the reflected signals differ depending on the state of contact of the tips of the signal terminals and tips of the ground terminals with the conductor surface 22.

Figure 4:
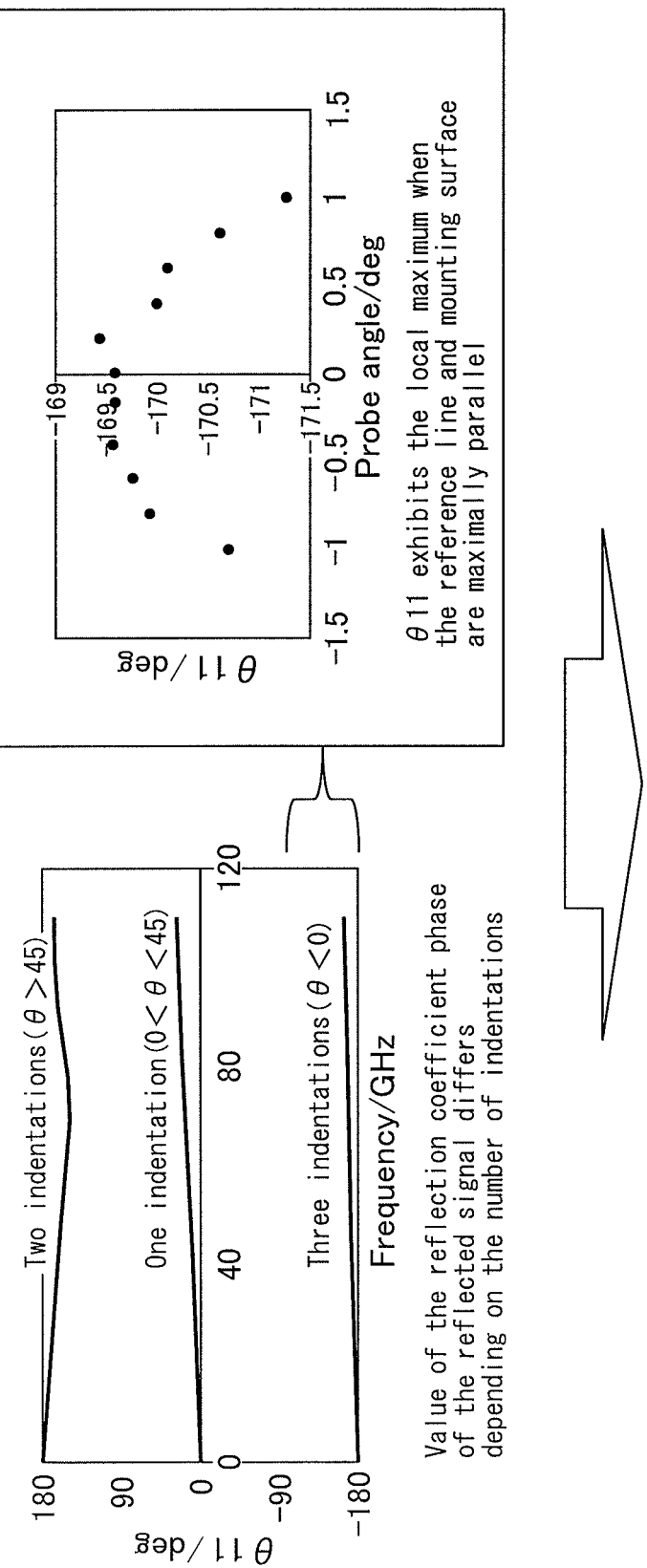
FIG. 4 is a drawing illustrating the relationship between number of indentations and reflected signal reflection coefficient phase, and the relationship between probe angle and reflected signal phase.

The graph at left in FIG. 4 shows the relationship between the number of indentations and the reflection coefficient phases of reflected signals.

The data in the graph at left in FIG. 4 were measured using a high-frequency test system 8 having a G-S-G type probe 1. For each number of indentations 1 to 3, the frequency of the signal output from the signal terminal was scanned to measure the reflection coefficient phase θ11.

(For One Indentation)

Figure 5:
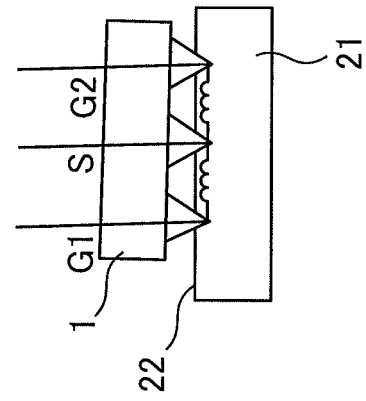
FIG. 5(A) to (C) are drawings illustrating the relationship between probe angle and state of contact with the conductor surface.
Figure 5:
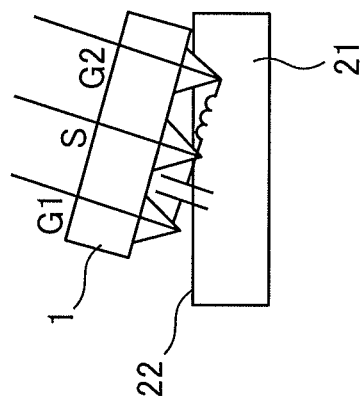
Figure 5:
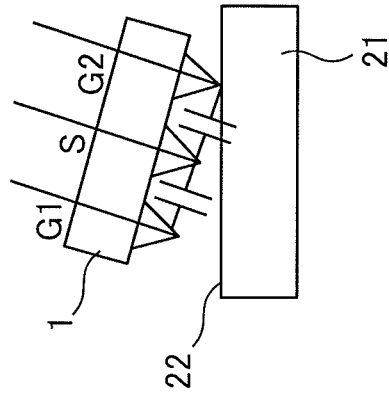

When the number of indentations formed on the conductor surface 22 of the substrate 21 is one, as shown in FIG. 5(A), the tip of the second ground terminal contacts with the conductor surface 22, but the first ground terminal and the signal terminal are not in contact with the conductor surface 22. The probe 1 and conductor surface 22 form an equivalent circuit in which two capacitors are connected in series.

When the number of indentations is one, as shown in FIG. 4, the reflection coefficient phase θ11 of the reflected signal is a value between 0° and 45°.

(For Two Indentations)

When the number of indentations formed on the conductor surface 22 of the substrate 21 is two, as shown in FIG. 5(B), the tips of the second ground terminal and the signal terminal are in contact with the conductor surface 22, but the first ground terminal is not in contact with the conductor surface 22. The probe 1 and conductor surface 22 form an equivalent circuit in which one capacitor and one inductor are connected in series.

When the number of indentations is two, as shown in FIG. 4, the reflection coefficient phase θ11 of the reflected signal is a positive value that is larger than 45°.

(For Three Indentations)

When the number of indentations formed on the conductor surface 22 of the substrate 21 is three, as shown in FIG. 5(C), the tips of the two ground terminals and the one signal terminal are in contact with the conductor surface 22. The probe 1 and conductor surface 22 form an equivalent circuit in which two inductors are connected in series.

When the number of indentations is three, as shown in FIG. 4, the reflection coefficient phase θ11 of the reflected signal is a negative value.

The graph at right in FIG. 4 shows the relationship between the reflection coefficient phase θ11 of the reflected signal and the probe angle, where the number of indentations is three. The state of contact between the probes 1 and the conductor surface 22 of the substrate 21 is with three indentations, and a signal of a predetermined frequency is output from the signal terminal, while changing the probe angle, to measure the reflection coefficient phase θ11.

The present inventors have found that when the reference line L and conductor surface 22 are most parallel, the reflection coefficient phase θ11 of the reflected signal is a negative value and exhibits the local maximum (also referred to as negative maximum). The conductor surface 22 is parallel with the mounting surface of the sample stage 2. In other words, when the reflection coefficient phase θ11 is the negative maximum, the reference line L and mounting surface are in the maximally parallel positional relationship. In this positional relationship, the DUT may be mounted on the mounting surface and the electrical characteristics of the DUT measured, to make an accurate evaluation.

Therefore, as a result of changes in the probe angles of the probes 1, the high-frequency test system 8 determines the angle where the reflection coefficient phase θ11 of the reflected signal is the negative maximum, as the reference probe angle.

Figure 6:
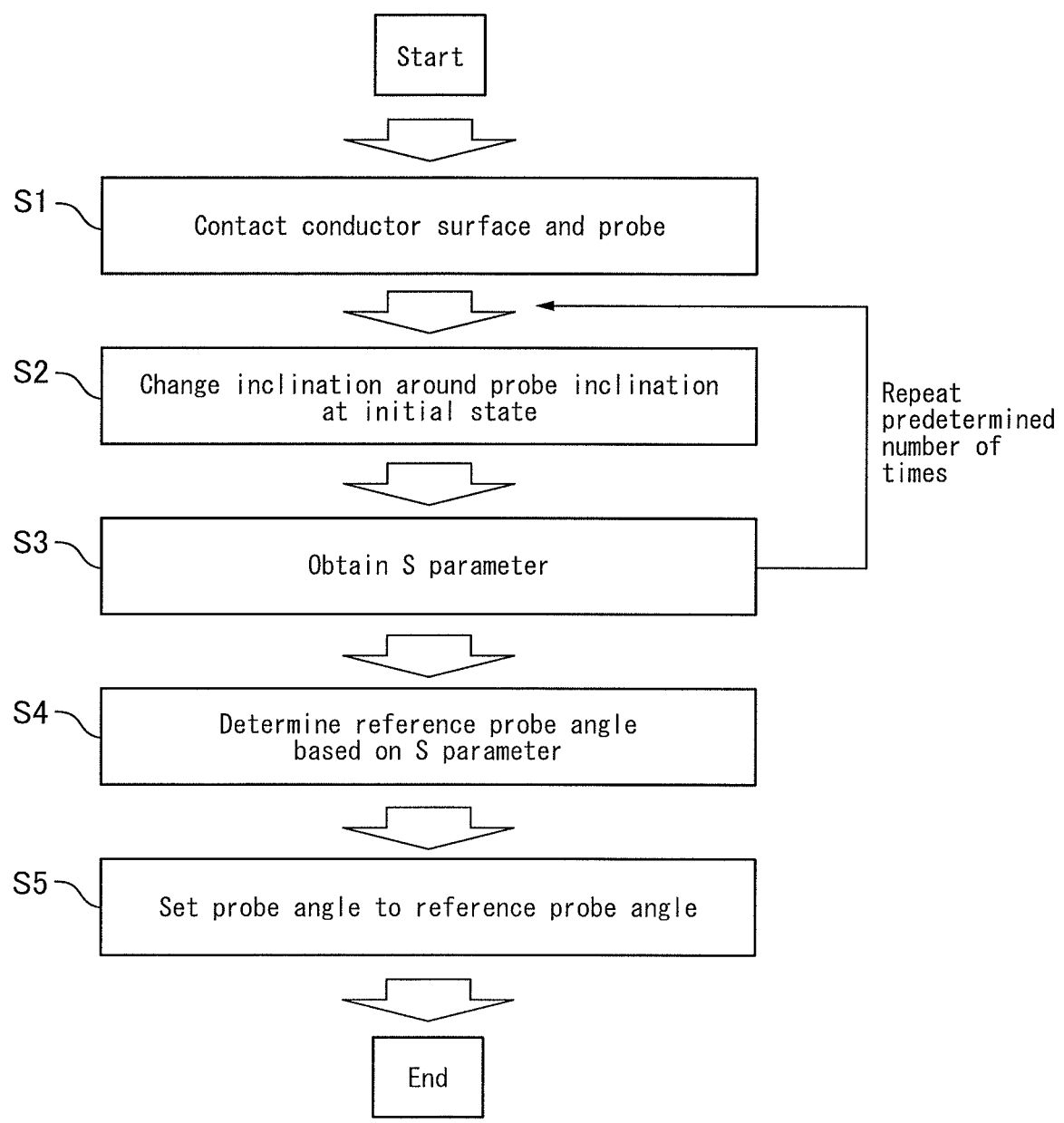
FIG. 6 is a flow chart for a first operation example of the high-frequency test system disclosed herein.

A first operation example of determining the reference probe angle by the high-frequency test system 8 will now be explained with reference to the flow chart shown in FIG. 6. For this operation example, a G-S-G type probe 1 was used.

First, in step S1, an adjusting substrate 21 with a conductor surface 22 is mounted on the mounting surface of the sample stage 2. The controller 7 is operated manually and visually, for example, to cause contact between the conductor surface 22 and at least one among the one tip of the signal terminal and the two tips of the ground terminals of the probe 1 (initial state).

In the following step S2, the controller 7 changes the probe angle with the probe angle of the probe 1 in the initial state as the center. Specifically, the controller 7 controls the tilt stages 17 to change the probe angles, thereby changing the state of contact of the tips of the signal terminals and the tips of the ground terminals of the probes 1, with the conductor surface 22. For example, the controller 7 controls the tilt stages 17 to change the probe angles to within a predetermined range (−5°-+5°), by a predetermined step (for example, 0.2°), with the initial state as reference. The processing in step S2 and step S3 described below are repeated a predetermined number of times. Alternatively, the probe angles may be unchanged in the first step S2, changing the probe angles only from the second step onward.

Next, in step S3, the controller 7 controls the vector network analyzer 3 to output a high-frequency signal from the signal terminal to the conductor surface 22 and receive a reflected signal using each probe 1, at different probe angles, to determine S11 parameters.

By repeating the processing of step S2 and step S3 it is possible to obtain S11 parameters for different probe angles. As a result, the vector network analyzer 3 inputs reflected signals for a plurality of the probe angles and obtains a plurality of the S11 parameters.

Next, in step S4, the controller 7 determines the reference probe angles of the probes 1 based on a plurality of the S11 parameters. Specifically, the controller 7 determines the reflection coefficient phases θ11 for a plurality of the reflected signals based on a plurality of the S11 parameters. The controller 7 also extracts data representing the negative phase θ11. Based on changes in the probe angles, the controller 7 determines the probe angles at which the reflection coefficient phase θ11 of the reflected signals is the negative maximum, to be the reference probe angles for the probes 1. The reference probe angles also include cases where the relationship between the reference line L and the conductor surface 22 is not strictly parallel. Some error in the degree of parallelism between the reference line L and conductor surface 22 due to the resolving power of the tilt stages 17 is acceptable.

Next, in step S5, the controller 7 controls the tilt stages 17, setting the probe angles of the probes 1 to the reference probe angle. The controller 7 is thus in a state capable of measuring the electrical characteristics of a DUT.

With the high-frequency test system of this embodiment, the proper probe inclination can be determined to high precision. Specifically, since the high-frequency test system of this embodiment does not determine the probe angles visually based on the number of indentations, problems (1) and (3) of the prior art can be solved. Furthermore, while the resolving power of the probe angles by the tilt stages 17 is 0.2° with the high-frequency test system in practical terms, it can even be improved up to about 0.001°. This allows problem (2) of the prior art to be solved.

Although G-S-G type probes 1 were used for the high-frequency test system of the first embodiment described above, the high-frequency test system may instead employ G-S-G-S-G type probes. In this case, in step S3 described above, the controller 7 controls the tilt stages 17 to change the probe angles, thereby changing the state of contact of the two tips of the signal terminals and the three tips of the ground terminals with the conductor surface 22, while also controlling the vector network analyzer 3 to output high-frequency signals from the first signal terminal and second signal terminal to the conductor surface 22 and receive a first reflected signal and second reflected signal using the probes 1, at different probe angles, to determine the first S-parameters and second S-parameters. In step S4, the controller 7 also determines the phases of a plurality of the first reflected signals based on a plurality of the first S-parameters, and determines the phases of a plurality of the second reflected signals based on a plurality of the second S-parameters. The controller 7 also extracts data representing the negative phase θ11. Based on changes in the probe angles, the controller 7 determines the probe angle at which the phase of the first reflected signal is a negative local maximum and the phase of the second reflected signal is a negative local maximum, to be the reference probe angle.

A second operation example of the high-frequency test system of this embodiment will now be explained with reference to FIG. 7(A) to FIG. 7(C).

For this operation example, processing by the high-frequency test system in step S4 is different from the first operation example.

In step S4 of this operation example, as a result of changing the probe angle, the controller 7 determines a first probe angle when the S11 parameter has entered a predetermined region from outside the predetermined region on multiple complex planes. In addition, as a result of changing the probe angle, the controller 7 determines a second probe angle when the S11 parameter exits from inside a predetermined region to outside the predetermined region. The controller 7 also determines the average value of the first probe angle and second probe angle, as the reference probe angle.

Figure 7:
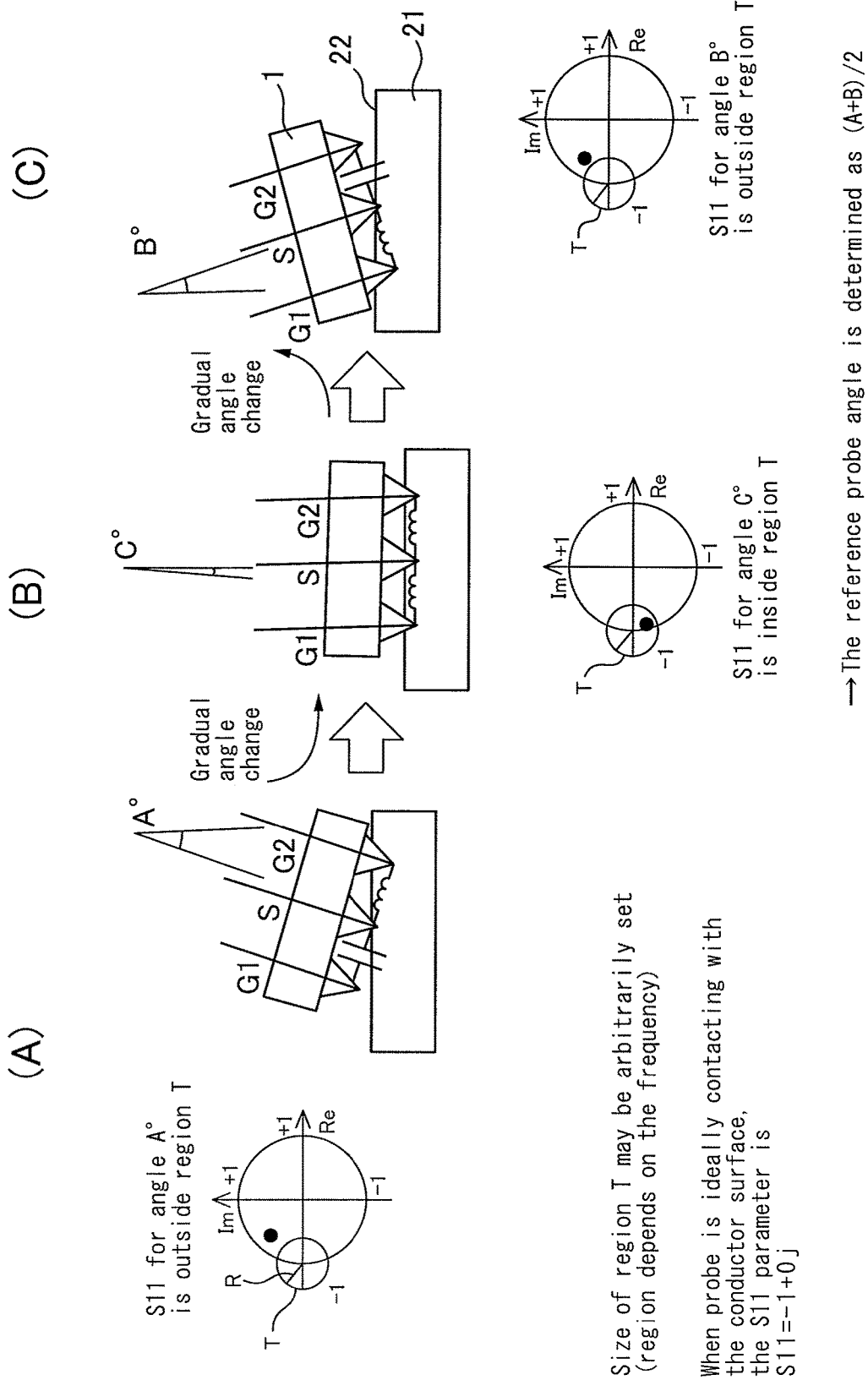
FIG. 7(A) to (C) are drawings illustrating a second operation example of the method disclosed herein.

In the state of probe angle A shown in FIG. 7(A), the tips of the second ground terminal and the signal terminal of the probe 1 are in contact with the conductor surface 22, but the first ground terminal is not in contact with the conductor surface 22. However, changing the tilt stage 17 by just the resolving power results in the state shown in FIG. 7(B).

In the state of probe angle A shown in FIG. 7(A), the S11 parameter is outside of region T on the complex plane.

Region T is preferably set as a range of the location of the S11 parameter obtained when the tips of all of the ground terminals and signal terminals of the probe 1 are in sufficient electrical contact with the conductor surface 22.

When the tips of all of the ground terminals and signal terminals of the probe 1 are in ideal electrical contact with the conductor surface 22, the S11 parameter will be located at the point (−1, 0) on the complex plane. In this operation example, the region T is set as a circular region within a radius R with the point (−1, 0) on the complex plane as the center. The radius R can be set based on the shapes of the tips of the ground terminals and signal terminals, the frequency of the signal, and the system noise, for example.

The controller 7 controls the vector network analyzer 3 and tilt stages 17 to gradually change the probe angle, while assessing whether or not the S11 parameter is within region T. The degree to which the probe angle is changed is preferably the resolving power of the tilt stages 17, for example, from the viewpoint of precisely obtaining the reference probe angle.

The controller 7 obtains an angle A as the probe angle when the S11 parameter enters into region T from outside region T on the complex plane.

In the state shown in FIG. 7(B), the tips of all of the ground terminals and the signal terminal of the probe 1 are in contact with the conductor surface 22.

In the state shown in FIG. 7(B), the S11 parameter is inside the region T on the complex plane.

In addition, the controller 7 controls the vector network analyzer 3 and tilt stages 17 to gradually change the probe angle, while assessing whether or not the S11 parameter is within region T.

FIG. 7(C) shows a state where the probe angle has reached angle B.

In the state of probe angle B shown in FIG. 7(C), the tips of the first ground terminal and the signal terminal of the probe 1 are in contact with the conductor surface 22, but the second ground terminal is not in contact with the conductor surface 22. However, changing the tilt stage 17 by just the resolving power results in the state shown in FIG. 7(B).

In the state of probe angle B shown in FIG. 7(C), the S11 parameter is outside of region T on the complex plane.

The controller 7 obtains an angle B as the probe angle when the S11 parameter exits out from region T from inside region T.

The controller 7 also determines the average value of probe angle B and probe angle A=(A+B)/2, as the reference probe angle C.

With this operation example, the same effect can be exhibited as with the first operation example.

A third operation example of the high-frequency test system of this embodiment will now be explained with reference to FIG. 8(A) to FIG. 8(C).

This operation example differs from the first operation example in that the probe 1 is a G-S-G-S-G type, and in the processing by the high-frequency test system in step S3 and step S4.

In this operation example, in step S3, the controller 7 controls the tilt stages 17 to change the probe angles, thereby changing the state of contact of the two tips of the signal terminals and the three tips of the ground terminals with the conductor surface 22, while also controlling the vector network analyzer 3 to output high-frequency signals from the first signal terminal and second signal terminal to the conductor surface 22 and input a first reflected signal and second reflected signal using the probes 1, at different probe angles, to determine the first S-parameters and second S-parameters.

In step S4 of this operation example, as a result of changing the probe angle, the controller 7 determines a first probe angle when both the first S-parameter and second S-parameter are within predetermined regions. In addition, as a result of changing the probe angle, the controller 7 determines a second probe angle when either or both the first S-parameter and second S-parameter exit from inside a predetermined region to outside the predetermined region. The controller 7 also determines the average value of the first probe angle and second probe angle, as the reference probe angle.

Figure 8:
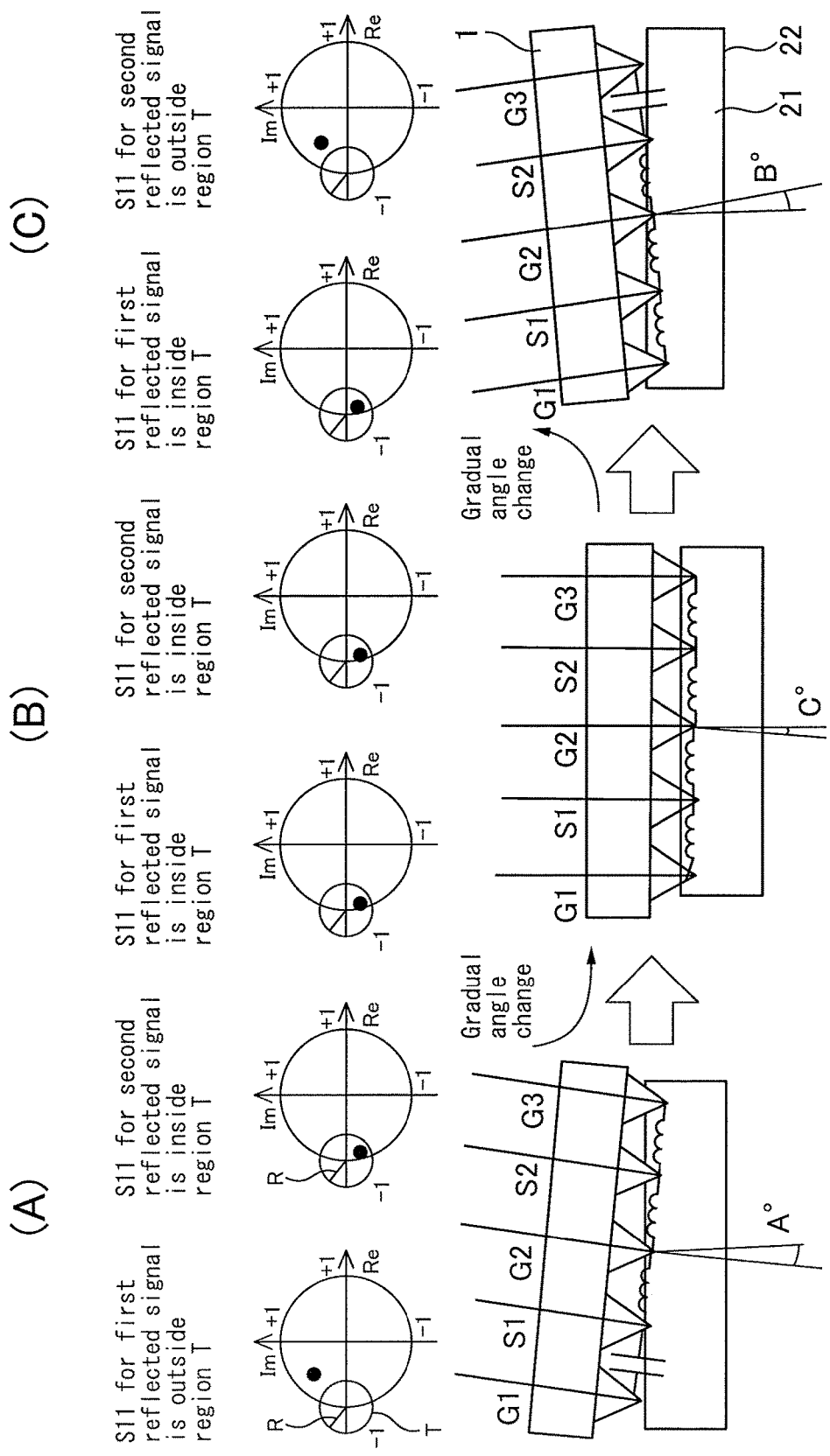
FIG. 8(A) to (C) are drawings illustrating a third operation example of the method disclosed herein.

In the state shown in FIG. 8(A), the tips of the second and third ground terminals and the first and second signal terminals of the probe 1 are in contact with the conductor surface 22, but the first ground terminal is not in contact with the conductor surface 22. However, changing the tilt stage 17 by just the resolving power results in the state shown in FIG. 8(B).

In the state shown in FIG. 8(A), the S11 parameter of the first reflected signal input from the first signal terminal is outside of region T on the complex plane, and the S11 parameter of the second reflected signal input from the second signal terminal is inside region T on the complex plane.

The controller 7 controls the vector network analyzer 3 and tilt stages 17 to gradually change the probe angle, while assessing whether or not the two S11 parameters are within region T.

The controller 7 obtains an angle A as the probe angle when both of the two S11 parameters enter into region T.

In the state shown in FIG. 8(B), the tips of all of the three ground terminals and two signal terminals of the probe 1 are in contact with the conductor surface 22.

In the state shown in FIG. 8(B), the S11 parameter of the first reflected signal input from the first signal terminal and the S11 parameter of the second reflected signal input from the second signal terminal are both inside region T on the complex plane.

The controller 7 then further controls the vector network analyzer 3 and tilt stages 17 to gradually change the probe angle, while assessing whether or not the S11 parameter is within region T.

FIG. 8(C) shows a state where the probe angle has reached angle B.

In the state of the probe angle B shown in FIG. 8(C), the tips of the first and second ground terminals and the first and second signal terminals of the probe 1 are in contact with the conductor surface 22, but the third ground terminal is not in contact with the conductor surface 22. However, changing the tilt stage 17 by just the resolving power results in the state shown in FIG. 8(B).

In the state of the probe angle B shown in FIG. 8(C), the S11 parameter of the first reflected signal input from the first signal terminal is inside region T on the complex plane, and the S11 parameter of the second reflected signal input from the second signal terminal is outside of region T on the complex plane.

The controller 7 obtains an angle B as the probe angle when either or both the first S11 parameter and second S11 parameter (the second S11 parameter for this operation example) have exited out from region T from inside region T.

The controller 7 also determines the average value of probe angle B and probe angle A=(B+A)/2, as the reference probe angle C.

With this operation example, the same effect can be exhibited as with the first operation example.

For the present invention, the method, the high-frequency test system, program and storage medium of the embodiments described above may implement appropriate modifications such as are within the scope of the gist thereof.

For example, the S11 parameter was used as the reflected signal S-parameter in the embodiment described above, but another parameter may be used instead for the reflected signal S-parameter. For example, the S22 parameter may be used as the reflected signal S-parameter.

REFERENCE SIGNS LIST

1 Probe
2 Sample stage
2a Translating stage
2b Rotating stage
3 Vector network analyzer
4 Frequency extension unit
5 Pedestal
7 Controller (computer)
8 High-frequency test system
16 Probe stage
17 Tilt stage (driving unit)
19 DUT
20 Microscope
21 Substrate
22 Conductor surface

The invention claimed is:

1. A method for determining a reference angle of a probe around a rotation axis in a high-frequency test system including
 a controller,
 a vector network analyzer controlled by the controller,
 a stage having a flat mounting surface on which a device under test or a substrate that has a flat conductor surface is mounted,
 a probe having one or more signal terminals and one or more ground terminals that are able to send and receive signals with the vector network analyzer, the probe being able to change the state of contact of the tip of the signal terminal and tip of the ground terminal with the device under test by rotating with the rotation axis as the center, and
 a driving unit that is controlled by the controller and causes rotation of the probe around the rotation axis,
comprising:
 the controller controlling the driving unit to change the angle of the probe around the rotation axis, thereby changing the state of contact of the tip of the signal terminal and tip of the ground terminal, with the conductor surface of the substrate mounted on the mounting surface of the stage, while controlling the vector network analyzer to output a high-frequency signal from the one or more signal terminals to the conductor surface and receive a reflected signal using the probe, at different angles of the probe around the rotation axis;
 the controller obtaining a plurality of S-parameters from the vector network analyzer; and
 the controller determining, based on a plurality of the S-parameters, the reference angle of the probe around the rotation axis at which a reference line formed connecting the tip of the signal terminal and tip of the ground terminal is parallel with the conductor surface.

2. The method according to claim 1, wherein the determining the reference angle comprises:
 the controller finding the phases of a plurality of the reflected signals based on a plurality of the S-parameters; and the controller determining the angle at which the phase of the reflected signal is a negative value and exhibits the local maximum, as the reference angle of the probe around the rotation axis.

3. The method according to claim 2, wherein the probe has one signal terminal.

4. The method according to claim 2, wherein
the probe has two signal terminals, and
the controller controlling the driving unit to change the angle of the probe around the rotation axis, thereby changing the state of contact of the tips of the signal terminals and tips of the ground terminals with the conductor surface of the substrate, while controlling the vector network analyzer to output a high-frequency signal from the first signal terminal and the second signal terminal to the conductor surface and receive first reflected signals and second reflected signals using the probe, at different angles of the probe around the rotation axis, and
the controller obtaining the first S-parameters corresponding to the first reflected signals and the second S-parameters corresponding to the second reflected signals from the vector network analyzer, and
the determining the reference angle comprises:
the controller, finding the phases of a plurality of the first reflected signals based on a plurality of the first S-parameters and finding the phases of a plurality of the second reflected signals based on a plurality of the second S-parameters; and
based on a result of changing the angle of the probe around the rotation axis, determining the angle at which the phase of the first reflected signal is a negative value and exhibits the local maximum and the phase of the second reflected signal is a negative value and exhibits the local maximum, as the reference angle of the probe around the rotation axis.

5. The method according to claim 1, wherein the determining the reference angle comprises
the controller, based on a result of changing the angle of the probe around the rotation axis, finding a first angle of the probe around the rotation axis when the S-parameter has entered a predetermined region from outside the predetermined region on a complex plane,
as a result of changing the angle of the probe around the rotation axis, finding a second angle of the probe around the rotation axis when the S-parameter has exited the predetermined region from inside the predetermined region; and
determining the average value of the first angle and second angle as the reference angle of the probe around the rotation axis.

6. The method according to claim 5, wherein the probe has one signal terminal.

7. The method according to claim 5, wherein
the probe has two signal terminals, and
the controller controlling the driving unit to change the angle of the probe around the rotation axis, thereby changing the state of contact of the tip of the signal terminal and tip of the ground terminal with the conductor surface of the substrate, while controlling the vector network analyzer to output a high-frequency signal from the first signal terminal and the second signal terminal to the conductor surface and receive first reflected signals and second reflected signals using the probe, at different angles of the probe around the rotation axis, and the controller obtaining the first S-parameters corresponding to the first reflected signals and the second S-parameters corresponding to the second reflected signals from the vector network analyzer, and
the determining the reference angle comprises:
the controller, based on a result of changing the rotation axis of the probe, finding a first angle of the probe around the rotation axis when both the first S-parameter and the second S-parameter have entered into the predetermined region;
the controller, based on a result of changing the angle of the probe around the rotation axis, finding a second angle of the probe around the rotation axis when either or both the first S-parameter and second S-parameter have exited out of the predetermined region from inside the predetermined region; and
the controller determining the average of the first angle and second angle as the reference angle of the probe around the rotation axis.

8. The method according to claim 1, wherein
the controller controlling the driving unit, with reference to a state of having caused contact between the conductor surface and at least one among the tip of the one or more signal terminals and the one or more ground terminals, to change the angle of the probe around the rotation axis to within a predetermined range.

9. A high-frequency test system comprising:
a controller;
a vector network analyzer controlled by the controller;
a stage having a flat mounting surface on which a device under test or a substrate that has a flat conductor surface is mounted;
a probe having one or more signal terminals and one or more ground terminals that are able to send and receive signals with the vector network analyzer, the probe being able to change the state of contact of the tip of the signal terminal and tip of the ground terminal with the device under test by rotating with the rotation axis as the center; and
a driving unit that is controlled by the controller and causes rotation of the probe around the rotation axis, wherein the controller
controls the driving unit to change the angle of the probe around the rotation axis, thereby changing the state of contact of the tip of the signal terminal and tip of the ground terminal with the conductor surface of the substrate mounted on the mounting surface of the stage, while controlling the vector network analyzer to output a high-frequency signal from the one or more signal terminals to the conductor surface and receive a reflected signal using the probe, at different angles of the probe around the rotation axis,
obtains a plurality of S-parameters from the vector network analyzer and determines, based on a plurality of the S-parameters, the reference angle of the probe around the rotation axis at which a reference line formed connecting the tip of the signal terminal and tip of the ground terminal is parallel with the conductor surface.

10. A non-transitory storage medium that stores a computer program that causes a computer to execute determination of a reference angle of a probe around the rotation axis in a high-frequency test system including
a computer,
a vector network analyzer controlled by the computer, a stage having a flat mounting surface on which a device under test or a substrate that has a flat conductor surface is mounted, a probe having one or more signal terminals and one or more ground terminals that are able to send and receive signals with the vector network analyzer, the probe being able to change the state of contact of the tip of the signal terminal and tip of the ground terminal with the device under test by rotating with the rotation axis as the center, and a driving unit that is controlled by the computer and causes rotation of the probe around the rotation axis, the computer program causing the computer to execute:

controlling of the driving unit to change the angle of the probe around the rotation axis, thereby changing the state of contact of the tip of the signal terminal and tip of the ground terminal with the conductor surface of the substrate mounted on the mounting surface of the stage, while controlling the vector network analyzer to output a high-frequency signal from the one or more signal terminals to the conductor surface and receive a reflected signal using the probe, at different angles of the probe around the rotation axis;

obtaining a plurality of S-parameters from the vector network analyzer; and determining, based on a plurality of the S-parameters, the reference angle of the probe around the rotation axis at which a reference line formed connecting the tip of the signal terminal and tip of the ground terminal is parallel with the conductor surface.

* * * * *